US012622110B2

(12) United States Patent
Xu et al.

(10) Patent No.: US 12,622,110 B2
(45) Date of Patent: May 5, 2026

(54) HIGH PIXEL DENSITY STRUCTURES AND METHODS OF MAKING

(71) Applicant: Applied Materials, Inc., Santa Clara, CA (US)

(72) Inventors: Lisong Xu, San Jose, CA (US); Mingwei Zhu, San Jose, CA (US); Byung Sung Kwak, Mountain View, CA (US); Hyunsung Bang, Sunnyvale, CA (US); Liang Zhao, Gilroy, CA (US); Hou T. Ng, Campbell, CA (US); Sivapackia Ganapathiappan, Los Altos, CA (US); Nag Patibandla, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/413,011

(22) Filed: Jan. 15, 2024

(65) Prior Publication Data

US 2024/0154070 A1 May 9, 2024

Related U.S. Application Data

(63) Continuation of application No. 17/345,970, filed on Jun. 11, 2021.

(51) Int. Cl.
*H10H 20/84* (2025.01)
*G02B 27/01* (2006.01)
(Continued)

(52) U.S. Cl.
CPC ......... *H10H 20/84* (2025.01); *G02B 27/0172* (2013.01); *H10H 20/0137* (2025.01);
(Continued)

(58) Field of Classification Search
CPC . H01L 25/0753; H01L 25/162; H01L 25/167; H01L 2933/0041; H01L 33/44;
(Continued)

(56) References Cited

U.S. PATENT DOCUMENTS 10,437,402 B1 * 10/2019 Pan ..................... H01L 23/5387
2019/0267357 A1 * 8/2019 Iguchi ................. H01L 25/0753
(Continued)

FOREIGN PATENT DOCUMENTS

CN         110211986 A  *  9/2019  ......... H01L 25/0753
CN         111863917 A     10/2020
(Continued)

OTHER PUBLICATIONS

Translation_of_CN110211986 (Year: 2019).*
(Continued)

*Primary Examiner* — Julio J Maldonado
*Assistant Examiner* — Nathan Pridemore
(74) *Attorney, Agent, or Firm* — Kilpatrick Townsend & Stockton LLP

(57) ABSTRACT

Methods of making high-pixel-density LED structures are described. The methods may include forming a backplane substrate and a LED substrate. The backplane substrate and the LED substrate may be bonded together, and the bonded substrates may include an array of LED pixels. Each of the LED pixels may include a group of isolated subpixels. A quantum dot layer may be formed on at least one of the isolated subpixels in each of the LED pixels. The methods may further include repairing at least one defective LED pixel by forming a replacement quantum dot layer on a quantum-dot-layer-free subpixel in the defective LED pixel. The methods may also include forming a UV barrier layer on the array of LED pixels after the repairing of the at least one defective LED pixel.

15 Claims, 11 Drawing Sheets

(51) Int. Cl.

| | |
|---|---|
| *H01L 21/66* | (2006.01) |
| *H01L 25/075* | (2006.01) |
| *H10H 20/01* | (2025.01) |
| *H10H 20/851* | (2025.01) |
| *H10H 20/857* | (2025.01) |
| *H10P 74/00* | (2026.01) |
| *H10W 90/00* | (2026.01) |

(52) U.S. Cl.
CPC ...... *H10H 20/8512* (2025.01); *H10H 20/857* (2025.01); *H10P 74/232* (2026.01); *H10W 90/00* (2026.01); *G02B 2027/0178* (2013.01); *H10H 20/034* (2025.01)

(58) Field of Classification Search
CPC ... H01L 33/0075; H01L 33/50; H01L 33/502; H01L 33/504; H01L 22/22; H10H 20/84; H10H 20/0137; H10H 20/8512; H10H 20/857; H10H 20/034; H10H 29/45; H10H 29/0361; H10H 29/8552; H10H 29/362; H10H 20/018; H10H 20/855; H10H 20/0361; H10H 29/012; H10H 29/30; H10H 29/37; H10H 29/8513; G02B 27/0172; G02B 2027/0178
See application file for complete search history.

(56) References Cited

U.S. PATENT DOCUMENTS

| | | | |
|---|---|---|---|
| 2020/0212269 A1* | 7/2020 | Akimoto | .............. G09G 3/2003 |
| 2020/0321391 A1 | 10/2020 | Danesh et al. | |
| 2020/0365774 A1 | 11/2020 | Zhang et al. | |
| 2021/0151632 A1 | 5/2021 | O'brien et al. | |
| 2022/0059735 A1* | 2/2022 | Akimoto | ........... H01L 27/14625 |
| 2022/0093834 A1 | 3/2022 | Lin et al. | |
| 2022/0352268 A1* | 11/2022 | Seo | ........................ H10K 71/00 |

FOREIGN PATENT DOCUMENTS

| | | |
|---|---|---|
| JP | 2019083301 A | 5/2019 |
| JP | 2019113782 A | 7/2019 |
| JP | 2020085960 A | 6/2020 |
| JP | 2021071645 A | 5/2021 |
| KR | 20150047365 A | 5/2015 |
| KR | 20200083273 A | 7/2020 |
| KR | 102169819 B1 | 10/2020 |
| KR | 20210014567 A | 2/2021 |
| TW | 202109938 A | 3/2021 |
| WO | WO-2020100470 A1 * | 5/2020 |
| WO | 2020208558 A1 | 10/2020 |
| WO | 2020232229 A1 | 11/2020 |
| WO | 2021101808 A1 | 5/2021 |

OTHER PUBLICATIONS

WIPO_WO2020100470_translation (Year: 2020).*
PE2E Merged CN110211986 (Year: 2019).*
PE2E merged WO2020100470_translation (Year: 2020).*
Application No. PCT/US2022/031857 , International Preliminary Report on Patentability, Mailed on Dec. 21, 2023, 7 pages.
Application No. PCT/US2022/031857 , International Search Report and the Written Opinion, Mailed on Sep. 27, 2022, 10 pages.
Korean Application No. 10-2024-7000998, Notice of Decision to Grant mailed on Jan. 14, 2026, 8 pages (5 pages of original document and 3 pages of English Translation).
European Application No. 22820789.0, Extended European Search Report mailed on Mar. 21, 2025, 9 pages.
Japanese Application No. 2023-576044, Office Action mailed on Sep. 9, 2025, 10 pages (5 pages of English Translation and 5 pages of original documents).
Japanese Application No. 2023-576044, Office Action mailed on Jan. 14, 2025, 11 pages (5 pages of English Translation and 6 pages of original documents).
Korean Application No. 10-2024-7000998, Office Action mailed on Apr. 1, 2025, 10 pages.
Taiwanese Application No. 111121633, Notice of Decision to Grant mailed on Apr. 26, 2024, 4 pages (2 pages of English Translation and 2 pages of original document).
Taiwanese Application No. 111121633, Office Action mailed on Oct. 6, 2023, 7 pages (1 page of English Translation and 6 pages of original documents).
Taiwanese Application No. 113127884, Notice of Decision to Grant mailed on Jan. 21, 2025, 4 pages (2 pages of English Translation and 2 pages of original document).
Taiwanese Application No. 113127884, Office Action mailed on Sep. 30, 2024, 5 pages (1 page of English Translation and 4 pages of original documents).

* cited by examiner

FIG. 6A
600
604
616
614
618
620
622
612
608
610
602
606
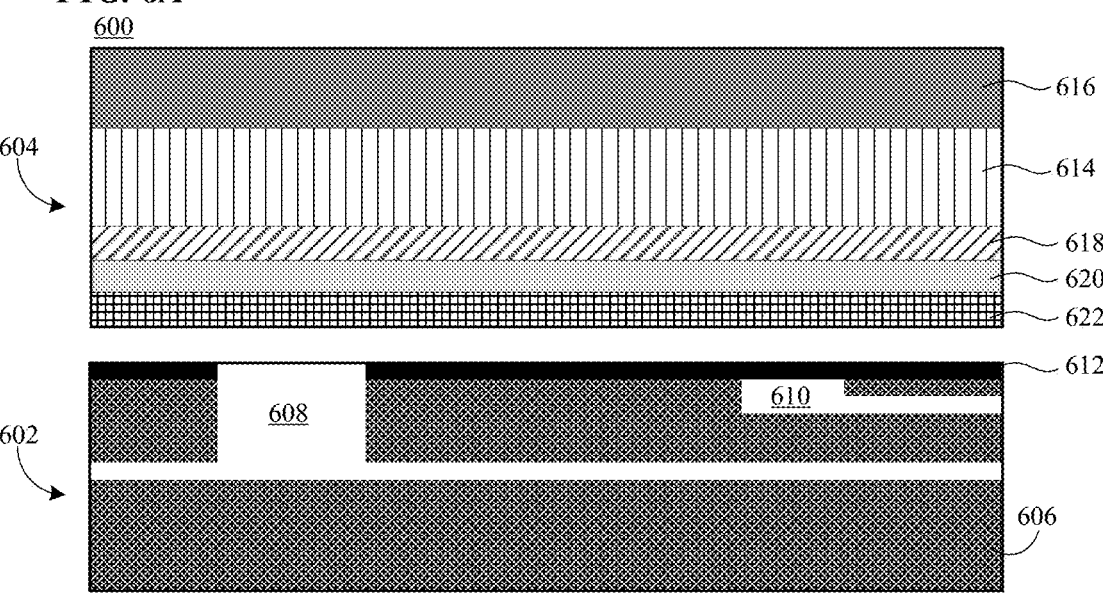
FIG. 6B
604
614
618
620
622
612
608
610
602
606
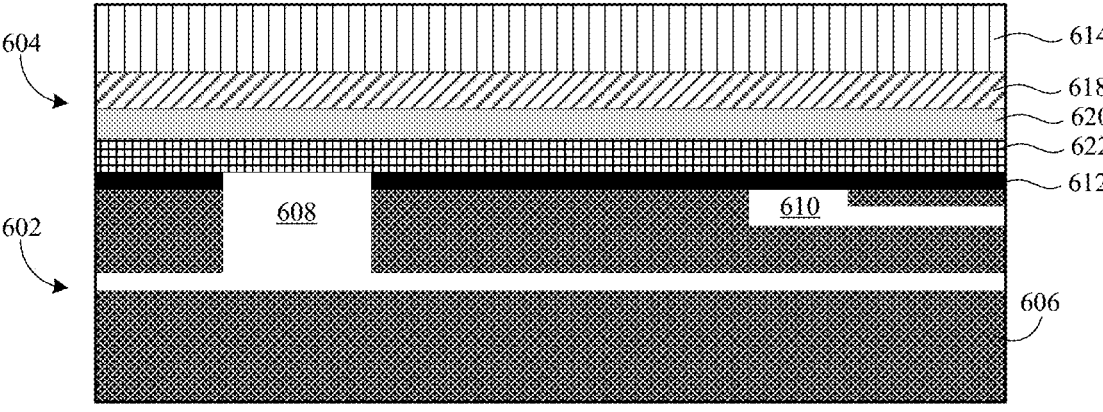
FIG. 6C
626    624
604
614
618
620
622
612
608
610
602
606

800

HIGH PIXEL DENSITY STRUCTURES AND METHODS OF MAKING

CROSS-REFERENCES TO RELATED APPLICATIONS

This application is a continuation of U.S. patent application Ser. No. 17/345,970 filed Jun. 11, 2021 entitled "HIGH PIXEL DENSITY STRUCTURES AND METHODS OF MAKING," the entire disclosure of which is hereby incorporated by reference, for all purposes, as if fully set forth herein.

TECHNICAL FIELD

The present technology relates to semiconductor processes and products. More specifically, the present technology relates to producing semiconductor structures and the devices formed.

BACKGROUND

Light-emitting-diode (LED) display devices made from millions of micron-sized pixels are made possible by fabrication processes that produce intricately patterned material layers on substrate surfaces. Producing patterned material on a substrate requires controlled methods for deposition and removal of materials. However, with new device designs, producing high-quality layers of material with very precise dimensions may be challenging.

Thus, there is a need for improved systems and methods that can be used to produce high-quality materials and structures for LED display devices. These and other needs are addressed by the present technology.

SUMMARY

The present technology includes exemplary semiconductor processing methods that include forming a backplane substrate and a LED substrate. The backplane substrate and the LED substrate are bonded together, and the bonded substrates include an array of LED pixels. Each of the LED pixels may include a group of isolated subpixels. A quantum dot layer may be formed on at least one of the isolated subpixels in each of the LED pixels. The methods may further include repairing at least one defective LED pixel by forming a replacement quantum dot layer on a quantum-dot-layer-free subpixel in the defective LED pixel. The methods may also include forming a UV barrier layer on the array of LED pixels after the repairing of the at least one defective LED pixel.

In additional embodiments, each of the LED subpixels may include a gallium-and-nitrogen-containing light-emitting-diode structure operable to emit a first-wavelength light characterized by a wavelength less than or about 400 nm. In further embodiments, the quantum dot layer is operable to absorb the first wavelength light emitted from the gallium-and-nitrogen-containing light-emitting-diode structure and emit a second-wavelength light characterized by a longer wavelength than the first-wavelength light. In still further embodiments, the replacement quantum dot layer is operable to emit light at the same wavelength as a quantum dot layer formed on a non-operating subpixel in the defective LED pixel. In yet additional embodiments, unrepaired LED pixels include a quantum-dot-layer-free subpixel after the formation of the UV barrier layer on the array of LED pixels. In more embodiments, the array of LED pixels has a pixel density of greater than or about 1000 pixels per inch. In still more embodiments, a longest dimension of each of the isolated subpixels is less than or about 10 μm. In yet more embodiments, the methods further include forming a micro-lens on at least one of the subpixels in each of the LED pixels.

The present technology also includes additional semiconductor processing methods that may include forming a backplane substrate and a LED substrate. The backplane substrate and the LED substrate may be bonded together, and the bonded substrates include an array of LED pixels. Each of the LED pixels may include at least four isolated subpixels. Quantum dot layers may be formed on at least three of the isolated subpixels in each of the LED pixels. Each of the quantum dot layers may be operable to emit visible light at a different wavelength than the other quantum dot layers in the LED pixel. The methods may further include forming a UV barrier layer on the array of LED pixels. In embodiments, at least a portion of the LED pixels includes at least one quantum-dot-layer-free subpixel after the formation of the UV barrier layer.

In additional embodiments, a pixel isolation structure may be formed in the LED substrate before the LED substrate and backplane substrate are bonded together. In further embodiments, a pixel isolation structure is formed in the bonded substrates after the LED substrate and backplane substrates are bonded together. In still further embodiments, a LED structure is formed into the LED substrate before the LED substrate and the backplane substrate are bonded together. In yet additional embodiments, a LED structure is formed in the bonded substrates after the LED substrate and the backplane substrate are bonded together. In more embodiments, an additional backplane substrate is bonded to the bonded substrates on an exposed surface of the LED substrate.

The present technology further includes semiconductor structures that may include a backplane layer, an array of LED pixels in contact with the backplane layer, and an UV barrier layer on the array of LED pixels. Each of the LED pixels may include at least four isolated subpixels. At least three of the isolated subpixels may include a quantum dot layer, and at least a portion of the LED pixels may include a subpixel that is quantum-dot-layer-free.

In additional embodiments, the backplane layer includes a silicon-containing layer with CMOS devices in electrical contact with each of the isolated subpixels in each of the LED pixels. In further embodiments, the semiconductor structures include pixel isolation structures between each of the subpixels in each of the LED pixels. The pixel isolation structures prevent light emitted from one of the subpixels from being absorbed by an adjacent subpixel. In still further embodiments, each of the subpixels may include a gallium-and-nitrogen-containing light-emitting-diode structure. In yet additional embodiments, at least one of the subpixels in each of the LED pixels further includes a microlens in contact with the UV barrier layer. In more embodiments, the semiconductor structures are incorporated into a LED display for a virtual reality headset or augmented reality glasses.

Such technology may provide numerous benefits over conventional semiconductor processing methods and structures. For example, embodiments of the processing methods may produce high pixel density displays with fewer defective pixels than conventional processing methods. In further embodiments, the processing methods may produce displays with pixel densities of greater than or about 1000 pixels per inch by bonding together a high-density LED substrate and a backplane substrate that includes sub-micron-sized control circuitry that can individually address the subpixels in each pixel of the display. In still further embodiments, the high-pixel-density, low-pixel-defect structures create an improved viewing experience in displays viewed at close range, such as in virtual reality headsets and augmented reality glasses. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 6A, FIG. 6B, FIG. 6C, FIG. 6D, and FIG. 6E show cross-sectional views of a semiconductor structure being processed according to embodiments of the present technology.

Figures 1A, 1B:
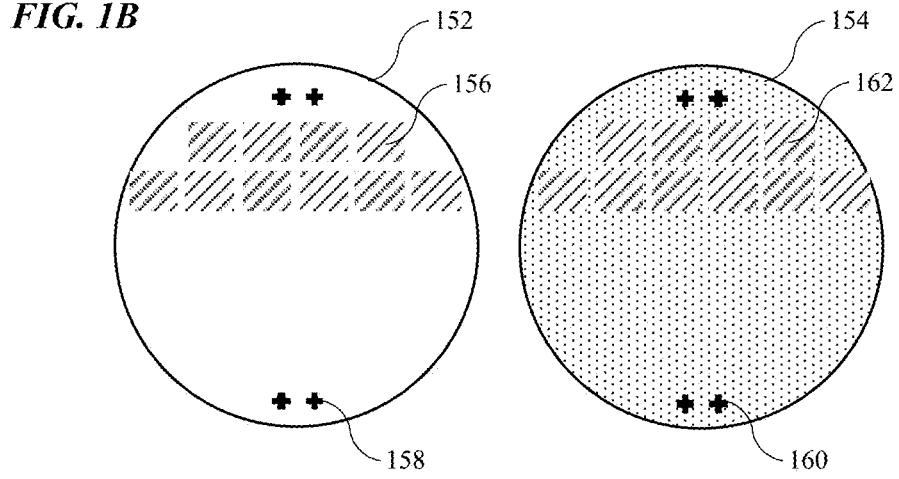
FIG. 1A and FIG. 1B show a top-down simplified view of backplane and LED substrates including fiducials to align the substrates for bonding according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes embodiments for making high-pixel-density light-emitting-diode devices with a low number of defective pixels. Additional embodiments include high-pixel-density semiconductor structures that can be incorporated into close-viewing display devices such as virtual reality headsets and augmented reality glasses, as well as high-resolution televisions, monitors, and displays for electronic devices such as smartphones and tablets. Embodiments of the present technology include methods of making semiconductor structures with greater than or about 1000 pixels per inch (ppi) that have so few defective pixels that they are undetectable by most viewers.

LCD display technology has made rapid increases in display resolution over the last decade. Most LED televisions and monitors made today have a pixel density of around 80 ppi (i.e., "4K" resolution), and displays with 160 ppi (i.e., "8K" resolution) are being offered by an increasing number of manufacturers. The display industry is starting to publicize a next-generation of high-resolution displays that have been called "micro-LED" displays (a.k.a., μ-LED) that have pixel densities of up to 650 ppi. However, even the resolution of these micro-LED displays may not be high enough for many applications where a viewer sees the display at very close range (e.g., less than or about three inches), such as virtual reality headsets and augmented reality glasses. For many of these applications, high pixel density displays having greater than or about 1000 ppi are needed for a satisfying user experience.

Unfortunately, conventional control circuitry for LCD subpixels fabricated from thin-film-transistors experience increased performance problems, including slower response times and reduced brightness, among other problems, as pixel density increases significantly above 600 ppi. Attempts to address these performance problems include the development of organic LED (OLED) technologies that have approached pixel densities of less than 1000 ppi. However, these OLED technologies use organic polymer materials that can degrade over time and shorten the lifetime of the display. Improved methods and structures are needed to fabricate stable high-pixel density structures for displays characterized by pixel densities greater than or about 1000 ppi.

Another problem with making high-pixel-density structures is that more pixels mean more opportunities for pixel defects during fabrication operations. Pixel defects include point defects in subpixels that fail to emit any light (i.e., "dead" subpixels) and subpixels that emit too much or too little light that create a color distortion in the overall pixel. Unfortunately, as the dimensions of the pixels get smaller in higher-pixel-density structures, it becomes increasingly difficult to isolate and replace point defects in the subpixels without disrupting adjacent subpixels and the control circuitry in one or more backplane layers that are in electronic communication with the subpixel. Improved methods are needed to replace subpixels in defective LED pixels to reduce the number of pixel defects in high-pixel-density structures.

Still another problem with increasing the pixel density to greater than or about 1000 ppi is the increased interference from light emitted by adjacent subpixels, a characteristic known as crosstalk. The increased crosstalk between the more tightly packed pixels and subpixels can create discolorations and image distortions on the display. Improved manufacturing methods and structures are needed to isolate the emitted light from each subpixel and prevent it from increasing the crosstalk with adjacent subpixels.

Embodiments of the present technology address problems with increasing the pixel density in high-pixel-density displays to greater than or about 1000 ppi. Embodiments include fabrication methods that grow the materials for the LEDs on one substrate (the LED substrate) and form the control circuitry for controlling the light emissions from the LEDs on a second substrate (the backplane substrate). In embodiments, the backplane substrate may be a silicon substrate in which CMOS circuitry is formed for addressing and activating each of the subpixels in the LED display. The CMOS circuitry may be characterized by fast response times to activate subpixels having a largest dimension of less than or about 10 μm.

Embodiments of the present technology also address problems with reducing the number of defective pixels in high-pixel-density structures. In embodiments, fabrication methods may include forming at least one extra subpixel in each of the LED pixels that can act as a replacement subpixel if one of the other subpixels in the LED pixel is defective. In further embodiments, the defective LED pixel may be repaired by forming a quantum dot layer in the extra subpixel that emits light at about the same wavelength as the subpixel being replaced. After repairing the defective LED pixels, the fabrication operations continue to produce a high-pixel-density structure with fewer or no defective LED pixels.

Embodiments of the present technology further include methods of making high-pixel-density structures with pixel isolation elements that prevent light emitted from one subpixel from interfering with the light emitted from an adjacent subpixel. The pixel isolation elements decrease the crosstalk created by light emitted from adjacent subpixels, which reduces discoloration and image distortion in displays incorporating the high-pixel-density structures.

LED-Containing High-Pixel-Density Structures

FIG. 1A and FIG. 1B each shows a top-down view of a backplane substrate and an LED substrate that may be bonded together to form a high-pixel-density structure according to embodiments of the present technology. FIG. 1A shows a backplane substrate 102 and a LED substrate 104. In embodiments, the backplane substrate 102 may be a silicon substrate in which CMOS device structures 106 are formed to address and control the subpixels of the LED pixels. In further embodiments, the LED substrate 104 may include layers of LED materials that form the subpixels of an array of LED pixels in a high-pixel-density structure. In further embodiments, the LED substrate 104 may include a substrate growth layer such as silicon or sapphire upon which the other layers of LED materials are formed. In the embodiment shown in FIG. 1A, LED structures may not be formed in the LED substrate 104 until after the substrates are bonded together. In further embodiments, the backplane substrate 102 and the LED substrate 104 further include fiducials 108 and 110, respectively, that help align the substrates during bonding.

FIG. 1B shows another embodiment of a backplane substrate 152 and a LED substrate 154. In embodiments, the backplane substrate 152 may be a silicon substrate in which CMOS device structures 156 are formed to address and control the subpixels of the LED pixels. In the embodiment shown in FIG. 1B, LED structures 162 are formed in the LED substrate 154 before the LED substrate is bonded together with the backplane substrate 154. In additional embodiments, the backplane substrate 152 and the LED substrate 154 further include fiducials 158 and 160, respectively, that help align the substrates during bonding.

Figure 2:
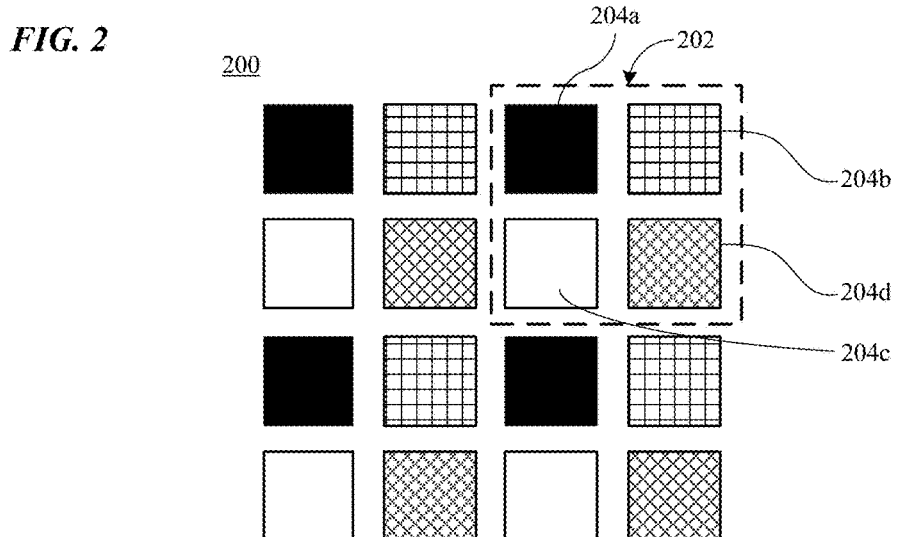
FIG. 2 shows a top-down view of a portion of an LED array according to embodiments of the present technology.

FIG. 2 shows a top-down view of a portion of an LED array 200 according to embodiments of the present technology. In the embodiment shown, the portion of the LED array 200 includes four LED pixels 202 that each include four subpixels 204a-d. The subpixels 204a-d include three subpixels 204a-c that are operable to emit visible light at different average peak wavelengths, and a fourth subpixel 204d that can function as a replacement subpixel if any of the other three subpixels 204a-c fail during fabrication of the high-pixel-density structure. In embodiments, the three subpixels 204a-c may be operable to emit visible light in the red, green, and blue portions of the electromagnetic spectrum. In additional embodiments, subpixel 204a may be considered a red subpixel that is operable to emit visible light characterized by a peak intensity wavelength of greater than or about 580 nm, greater than or about 585 nm, greater than or about 590 nm, greater than or about 595 nm, greater than or about 600 nm, greater than or about 605 nm, greater than or about 610 nm, greater than or about 615 nm, greater than or about 620 nm, or more. In further embodiments, subpixel 204b may be a green subpixel that is operable to emit visible light characterized by a peak intensity wavelength between 500 nm and 580 nm. In still further embodiments, subpixel 204c may be a blue subpixel that is operable to emit visible light characterized by a peak intensity wavelength less than or about 500 nm, less than or about 490 nm, less than or about 480 nm, less than or about 470 nm, less than or about 460 nm, less than or about 450 nm, less than or about 440 nm, less than or about 430 nm, less than or about 420 nm, less than or about 410 nm, less than or about 400 nm, or less. In yet further embodiments, the light emitted from the subpixels may be characterized by a spectral bandwidth of less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, or less.

In the embodiment shown in FIG. 2, the subpixels 204a-d are shown as square-shaped, and the pixels 202 are shown as a square-shaped arrangement of four square-shaped subpixels. It will be appreciated that embodiments of subpixels 204a-d may have additional shapes, such as rectangular-shaped, parallelogram-shaped, trapezoidal-shaped, pentagonal-shaped, hexagonal-shaped, heptagonal-shaped, octagonal-shaped, nonagonal-shaped, circular-shaped, and elliptical-shaped, among other kinds of shapes. In still further embodiments, the pixels 202 may also be arranged in additional shapes such as rectangular-shaped, parallelogram-shaped, trapezoidal-shaped, circular-shaped, and elliptical-shaped, among other kinds of shapes. In more embodiments, each of the subpixels 204a-d may be characterized by a longest dimension (e.g., a diagonal length) that is less than or about 10 μm, less than or about 9 μm, less than or about 8 μm, less than or about 7 μm, less than or about 6 μm, less than or about 5 μm, or less. In still more embodiments, each of the pixels 202 may be characterized by a longest dimension of less than or about 25 μm, less than or about 22.5 μm, less than or about 20 μm, less than or about 17.5 μm, less than or about 15 μm, less than or about 12.5 μm, less than or about 10 μm, or less.

Figure 3:
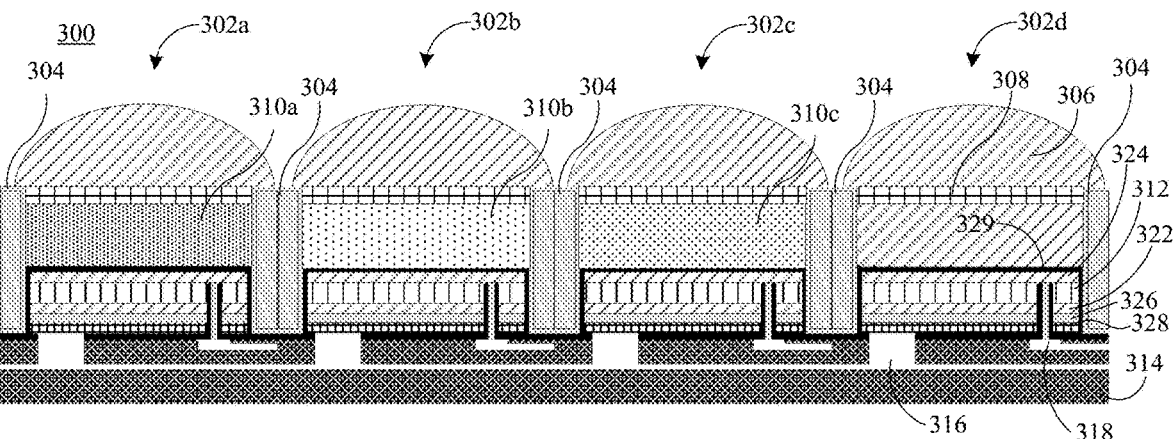
FIG. 3 shows a split-open cross-sectional view of a LED pixel according to embodiments of the present technology.

FIG. 3 shows a split-open cross-sectional view of a LED pixel 300 according to embodiments of the present technology. In the embodiment shown, an LED pixel, like the pixels 202 shown in FIG. 2, is cut between subpixels 204a-b and 204c-d and split open to reveal a cross-sectional liner arrangement of red, green, blue, and blank subpixels 302a-d. The subpixels 302a-d are isolated from each other by pixel isolation structures 304 between adjacent subpixels. In embodiments, one or more of the subpixels 302a-d may include a microlens 306 positioned on a UV barrier layer

308. In further embodiments, each subpixel 302a-c may further include a quantum dot layer 310a-c that is operable to emit different peak intensity wavelengths of visible light (e.g., red, green, and blue light). A fourth subpixel 302d may include a matrix material that is quantum-dot-layer-free unless it functions as a replacement subpixel for one of the other subpixels.

The subpixels 302a-d may include LED structures 312 operable to generate short-wavelength light that pumps a quantum-dot-layer 310a-c to emit longer-wavelength, visible light. In additional embodiments, the LED structures 312 may be independently activated by backplane substrate 314. In embodiments, the backplane substrate 314 may include a set of first contacts 316 and second contacts 318 formed in semiconductor layer 318 that independently address the LED structures 312. In embodiments, the contacts may be made of an electrically-conductive material such as copper, aluminum, gold, tungsten, chromium, or nickel, among other electrically-conductive materials. In still further embodiments, the LED structures 312 may be positioned between transparent electrically conductive layers 322 and 324 that form part of the electrical conduction pathway between the LED structures and the contacts in the backplane substrate 314. In additional embodiments, the transparent conductive layers may be made of indium tin oxide or indium zinc oxide, among other transparent conductive materials. In yet further embodiments, a mirror layer 326 may be positioned adjacent to the transparent electrical layer 324 to reflect light emitted by the LED structure towards the quantum dot layer. In more embodiments, the mirror layer may be made of one or more reflective metals such as copper, aluminum, chromium, silver, platinum, or molybdenum, among other reflective metals. In still further embodiments, an electrically-conductive bonding layer 328 that bonds the LED substrate to the backplane substrate may be positioned between the mirror layer 326 and the backplane substrate 314. In more embodiments, the electrically-conductive bonding layer may be made of one or more conductive materials such as tin, gold, or indium, among other conductive materials.

In additional embodiments, an electrically-insulating passivation layer 329 may be positioned around the LED structures 312 and adjacent electrically-conductive layers (e.g., transparent electrically-conductive layers 322 and 324, mirror layer 326, and bonding layer 328). The passivation layer 329 electrically isolates the LED structures 312 from other conductive materials in the subpixels 302a-d so that only the first and second contacts 316 and 318 can electrically switch on and off the LED structures. In embodiments, the passivation layer may be made of a dielectric material such as silicon oxide, silicon nitride, aluminum oxide, or aluminum nitride, among other dielectric materials. In further embodiments, the subpixels 302a-d may be independently switched on and off by sending electrical signals through the first contacts 316 and second contacts 318. The electrical signals may pass through the contacts and other electrically-conductive layers such as bonding layer 328, mirror layer 326, and transparent electrically-conductive layers 322 and 324 to activate the LED structures and cause them to emit light.

In further embodiments, the wavelength of light emitted by the LED structures 312 may be shorter (i.e., more energetic) than the wavelengths emitted by any of the quantum-dot-layers 310a-c. In additional embodiments, the LED structures 312 may be operable to emit light characterized by a peak intensity wavelength of less than or about 400 nm, less than or about 395 nm, less than or about 390 nm, less than or about 385 nm, less than or about 380 nm, less than or about 375 nm, less than or about 370 nm, less than or about 365 nm, less than or about 360 nm, less than or about 355 nm, less than or about 350 nm, or less. In still further embodiments, the LED structures 312 may emit the same or different peak intensity wavelengths of ultraviolet light.

Figure 4:
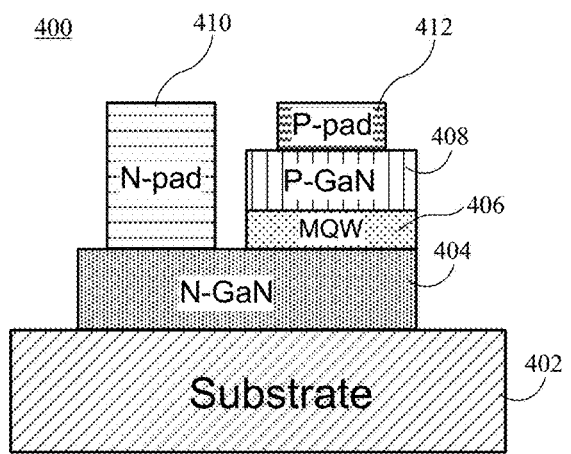
FIG. 4 shows a cross-sectional view of a gallium-and-nitrogen containing LED structure according to embodiments of the present technology.

In embodiments, the LED structures 312 may be gallium-and-nitrogen-containing LED structures. FIG. 4 shows a simplified cross-sectional view of a gallium-and-nitrogen-containing LED structure 400 that may be included in the high-pixel-density structures of the present technology. In the embodiment shown, the LED structure 400 is a gallium nitride LED structure that is epitaxially formed on a substrate 402. In additional embodiments, the substrate 402 may be a silicon substrate or a sapphire substrate, among other kinds of substrates. The LED structure further includes an n-doped GaN layer 404 and a p-doped GaN layer 408. Formed between the n-doped and p-doped GaN layers 404 and 408 is a multiple-quantum-well (MQW) region 406 where the light emitted by the LED structure is generated. The LED structure 400 may further include an electrically-conductive N-pad contact 410 that forms a pathway for electrical current to pass through the n-doped GaN layer 404. The LED structure 400 may also include an electrically-conductive P-pad contact 412 that forms a pathway for electrical current to pass through the p-doped GaN layer 408. The N-pad and P-pad contacts 410 and 412 may be connected to electrically-conducive layers in an LED subpixel or directly connected to contacts in the control circuitry of a backplane substrate. In embodiments, electrical signals from the control circuitry create a flow of electrical current through the LED structure 400 that causes light emission from the MQW region 406 of the structure. In additional embodiments, the MQW region 406 is formed to emit light characterized by a repeatable peak intensity wavelength and quantum efficiency for an applied electrical signal (e.g., electrical current and/or voltage). In embodiments, the peak intensity wavelength of the light emitted from the MQW region 406 may be an ultraviolet wavelength.

In FIG. 4, the LED structure 400 is shown fully formed on substrate 402. In additional embodiments discussed below, the substrate 402 may be removed from the layers of LED material that form the LED structure 400 before the structure is formed. In some of these embodiments, the LED substrate and a backplane substrate are bonded together before the LED material is formed into discrete LED structures like structure 400. In additional embodiments, the substrate 402 is separated from the layers of LED materials bonded together with the backplane substrate before the layers of LED materials are formed into the LED structures.

Returning to FIG. 3, the short-wavelength light emitted by the LED structures 312 may energize the quantum-dot-layers 310a-c and cause them to emit light of longer wavelengths. As noted above, each quantum-dot-layer 310a-c is operable to absorb light from its respective LED structure 312 and emit light in a different part of the electromagnetic spectrum. In the embodiment shown, quantum dot layer 310a is operable to emit light in the red portion of the spectrum, quantum dot layer 310b is operable to emit light in the green portion of the spectrum, and quantum dot layer 310c is operable to emit light in the blue portion of the spectrum. The light generated by quantum dot layers 310a-c and LED structures 312 pass through UV barrier layer 308 that absorbs ultraviolet light generated by the LED structures 312 while passing the visible light from the quantum dot layers 310*a-c*. In some embodiments, the light passing through the UV barrier layer 308 may be focused by a microlens 306 to further improve the quality of an image displayed by the high-pixel-density structure.

In embodiments of the present technology, the LED structures 312 may emit light characterized by the same or nearly the same peak intensity wavelength. These embodiments address a problem with gallium-and-nitrogen-containing LED structures having significantly different quantum efficiencies for light emissions at different peak intensity wavelengths. These differences are particularly pronounced between gallium-and-nitrogen-containing LED structures that emit red and blue visible light. The gallium-and-nitrogen-containing LED structures have significantly greater quantum efficiencies for the emission of the blue light than the red light, and in many cases, additional structures and operational techniques are required to compensate. In embodiments of the present technology, the LED structures 312 may be formed to emit light of the same or nearly the same peak intensity wavelength and may be selected to emit light at a wavelength that has a high quantum efficiency for the gallium-and-nitrogen-containing LED structures. In additional embodiments, the peak intensity wavelength may be an ultraviolet wavelength that can be absorbed by the quantum dot layers to cause them to emit light at visible wavelengths. In contrast to the gallium-and-nitrogen-containing LED structures that have a wide variation in the quantum efficiency of light emitted between the blue and red portions of the visible spectrum, the quantum dot layers have a narrower variation in the quantum efficiency for light absorbed at an ultraviolet wavelength to cause emission at different wavelengths of the visible spectrum.

In embodiments, the variation in the quantum efficiency of visible light emitted from quantum dot layers 310*a-c* may be less than or about 25%, less than or about 15%, less than or about 10%, less than or about 5%, less than or about 2.5%, less than or about 1%, or less. In additional embodiments, the quantum dot layers may be characterized by quantum efficiencies of greater than or about 50%, greater than or about 60%, greater than or about 70%, greater than or about 80%, greater than or about 90%, greater than or about 95%, greater than or about 97%, greater than or about 98%, greater than or about 99%, or more.

In further embodiments, crosstalk created by light generated from adjacent and nearby subpixels may be reduced or eliminated by the pixel isolation structures 304 between adjacent subpixels. In embodiments, the reduction in the intensity of light from adjacent and nearby pixels may be greater than or about 50%, greater than or about 60%, greater than or about 70%, greater than or about 80%, greater than or about 90%, greater than or about 95%, greater than or about 99%, or more. In additional embodiments, the pixel isolation structures 304 may include a core column of pixel isolation material that is covered by one or more additional layers of material, such as a layer of reflective material such as aluminum or copper. In embodiments, the material in the core column may include a metal or a dielectric material, among other types of materials. In further embodiments, the metal material may include one or more of silicon, tungsten, copper, and aluminum, among other metals. In yet further embodiments, the dielectric material may include one or more of silicon oxide, silicon nitride, silicon carbide, a photoresist material, or a dielectric organic-polymer material, among other dielectric materials.

In embodiments, the pixel isolation structures 304 may extend from the backplane substrate 314 to a top surface of the quantum-dot-layers 310*a-c*. In further embodiments, the pixel isolation structures 304 may extend to the UV barrier layer 308, and in yet further embodiments to the apex of the microlenses 306. In additional embodiments, the pixel isolation structures 304 may have a height of greater than or about 2.5 µm, greater than or about 5 µm, greater than or about 7.5 µm, greater than or about 10 µm, greater than or about 12.5 µm, greater than or about 15 µm, greater than or about 17.5 µm, greater than or about 20 µm, or more. In yet additional embodiments, the pixel isolation structures 304 may have a width of greater than or about 1 µm, greater than or about 2 µm, greater than or about 3 µm, greater than or about 4 µm, greater than or about 5 µm, greater than or about 6 µm, greater than or about 7 µm, greater than or about 8 µm, greater than or about 9 µm, greater than or about 10 µm, or more. In still further embodiments the pixel isolation structures 304 may have a height-to-width aspect ratio that is greater than or about 1.5:1, greater than or about 2:1, greater than or about 2.5:1, greater than or about 3:1, greater than or about 3.5:1, greater than or about 4:1, greater than or about 4.5:1, greater than or about 5:1, or more.

Methods of Making High-Pixel-Density LED Structures

Figure 5:
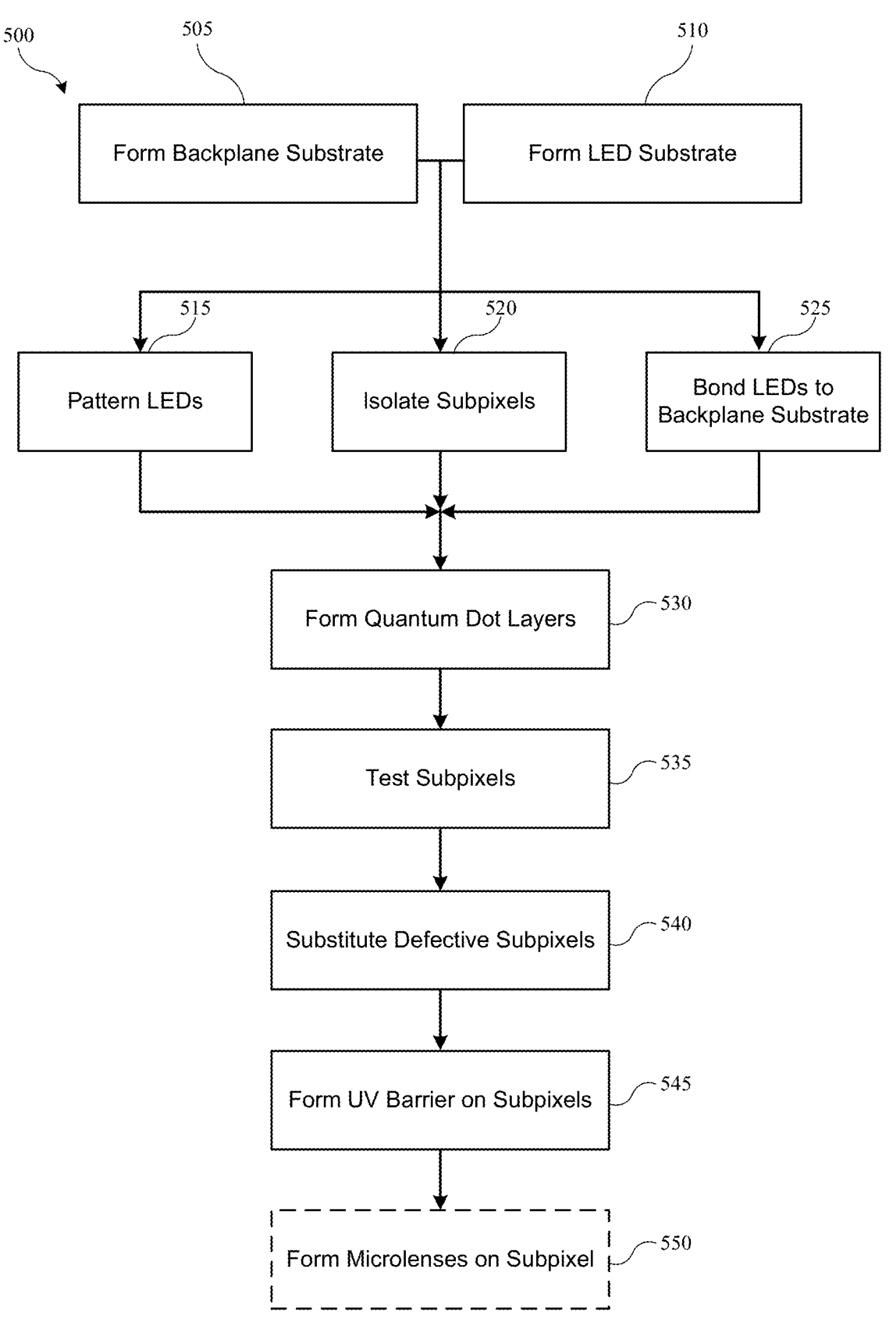
FIG. 5 shows exemplary operations in a method of forming high-pixel-density semiconductor structures according to some embodiments of the present technology.

FIG. 5 shows a flowchart with selected operations in a method 500 of forming high-pixel-density LED structures according to embodiments of the present technology. Method 500 may or may not include one or more operations prior to the initiation of the method, including front-end processing, deposition, etching, polishing, cleaning, or any other operations that may be performed prior to the described operations. The method may include a number of optional operations, which may or may not be specifically associated with some embodiments of methods according to the present technology. Method 500 describes operations to form embodiments of semiconductor structures shown in a simplified schematic form in FIGS. 6A-E, FIGS. 7A-F, FIGS. 8A-B, FIGS. 9A-B, and FIGS. 10A-B, the illustrations of which will be described in conjunction with the operations of method 500. It should be understood that FIGS. 6A-E, FIGS. 7A-F, FIGS. 8A-B, FIGS. 9A-B, and FIGS. 10A-B illustrate only partial schematic views with limited details, and in some embodiments, a substrate may contain any number of semiconductor sections having aspects as illustrated in the figures, as well as alternative structural aspects that may still benefit from any of the aspects of the present technology.

The embodiment described in method 500 includes operations to develop a high-pixel-density LED structure. Method 500 may include forming a backplane substrate 505 and forming a LED substrate 510. In embodiments, the backplane substrate may include a backplane layer that includes at least a portion of the control circuitry for activating the subpixels in each of the LED pixels of the high-pixel-density LED structure. In additional embodiments, the backplane layer may be a silicon layer in which elements of the control circuitry are formed, including contacts to form electrically conductive pathways through the interface between backplane substrate and the LED substrate.

In the embodiment of a high-pixel-density structure 600 shown in FIG. 6A, there is a separate backplane substrate 602 and LED substrate 604 provided. The backplane substrate 602 includes a backplane layer 606 in which a first contact 608 and a second contact 610 are formed. The backplane substrate 602 also includes an electrically-insulating passivation layer 612. In the embodiment shown, the high-pixel-density structure 600 may be part of a flip-chip LED structure in which all the control circuitry for the structure is formed in the backplane substrate 602 and positioned on one side of the LED structure. The LED substrate 604 includes a gallium-and-nitrogen-containing layer 614 formed on a LED substrate layer 616. The LED substrate 604 also includes a transparent conductive layer 618, mirror layer 620, and bonding layer 622 formed on the gallium-and-nitrogen-containing layer 614 opposite the side that is in contact with the LED substrate layer 616. In the embodiment shown in FIG. 6A, LED structures are not formed in the layers of LED material and surrounding material until after the backplane substrate 602 and LED substrate 604 are bonded together.

Figure 7A:
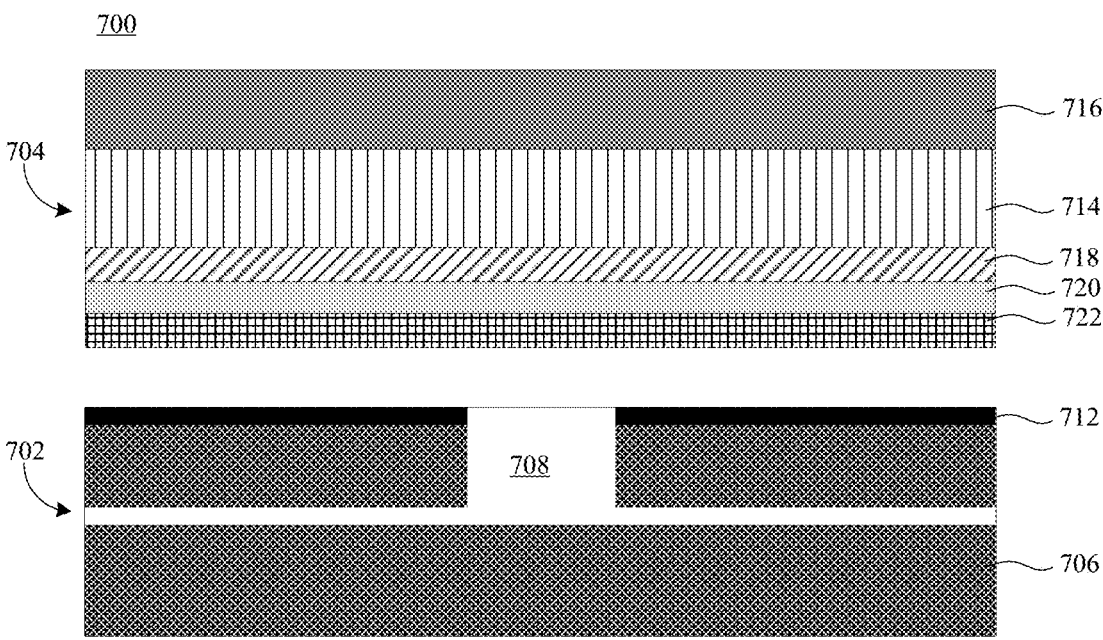
FIG. 7A, FIG. 7B, FIG. 7C, FIG. 7D, FIG. 7E, and FIG. 7F show cross-sectional views of another semiconductor structure being processed according to embodiments of the present technology.

FIG. 7A also shows a portion of high-pixel-density structure 700 having a separate backplane substrate 702 and LED substrate 704 according to embodiments. The backplane substrate 702 includes a backplane layer 706 in which a first contact 708 is formed. The backplane substrate 702 also includes an electrically-insulating passivation layer 712. In the embodiment shown, the high-pixel-density structure 700 may be part of a vertical LED structure in which a portion of the control circuitry for the structure is formed in the backplane substrate 702, and another portion of the control circuitry (not shown) is positioned on a side of the LED structures that is opposite the backplane substrate 702. The LED substrate 704 may include a stack of LED material layers formed on substrate layer 716. The LED material layers may include a gallium-and-nitrogen-containing layer 714, a transparent conductive layer 718, a mirror layer 720, and a bonding layer 722. In the embodiment shown in FIG. 7A, LED structures are not formed in the LED material layers until after the backplane substrate 702 and LED substrate 704 are bonded together.

Figure 8A:
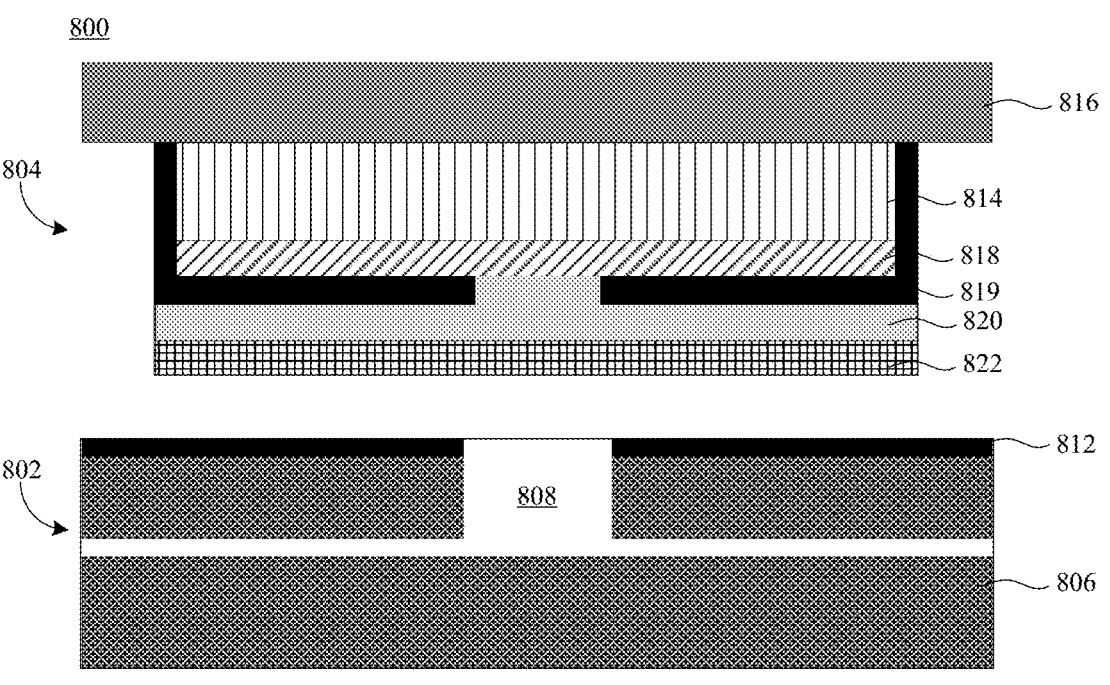
FIG. 8A and FIG. 8B show cross-sectional views of still another semiconductor structure being processed according to embodiments of the present technology.

FIG. 8A shows another embodiment of a portion of a high-pixel-density structure 800 having a separate backplane substrate 802 and LED substrate 804. The backplane substrate 802 includes a backplane layer 806 in which a first contact 808 is formed. The backplane substrate 802 also includes an electrically-insulating passivation layer 812. In the embodiment shown, the high-pixel-density structure 800 may be part of a vertical LED structure in which a portion of the control circuitry for the structure is formed in the backplane substrate 802, and another portion of the control circuitry (not shown) is positioned on a side of the LED structures that is opposite the backplane substrate 802. The LED substrate 804 may include a stack of LED material layers formed on substrate layer 816. The LED material layers may include a gallium-and-nitrogen-containing layer 814, a transparent conductive layer 818, a passivation layer 819, a mirror layer 820, and a bonding layer 822. In the embodiment shown in FIG. 8A, LED structures are already formed in the LED material layers before the backplane substrate 802 and LED substrate 804 are bonded together.

Figure 9A:
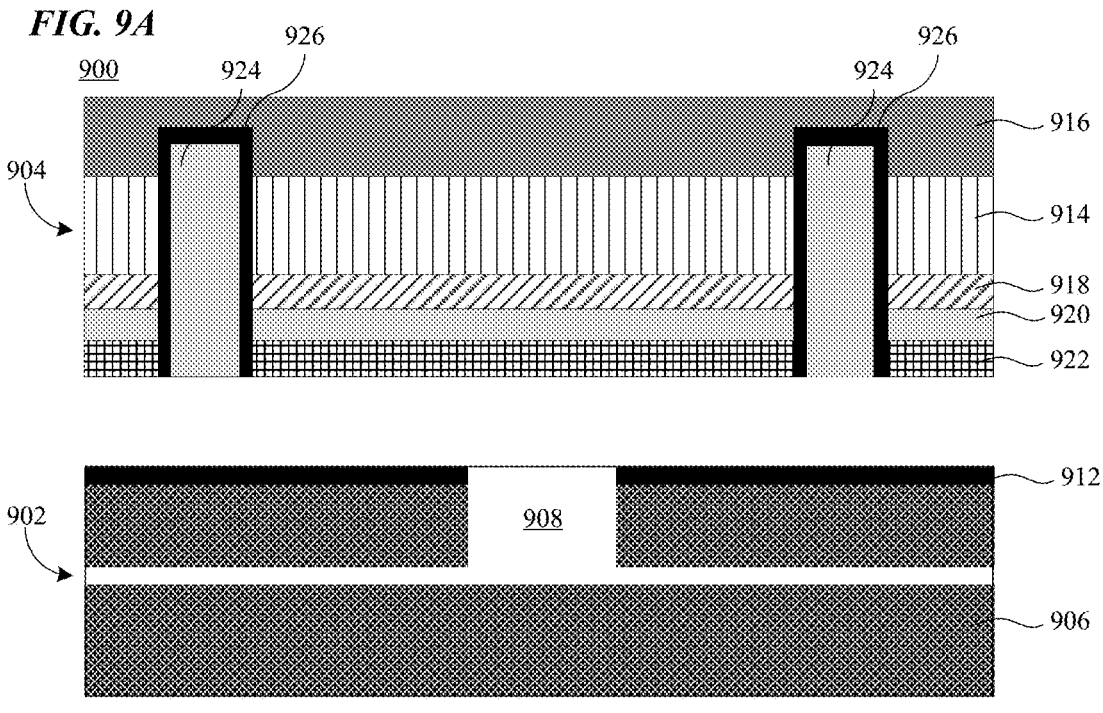
FIG. 9A and FIG. 9B show cross-sectional views of a further semiconductor structure being processed according to embodiments of the present technology.

FIG. 9A shows still another embodiment of a portion of a high-pixel-density structure 900 having a separate backplane substrate 902 and LED substrate 904. The backplane substrate 902 includes a backplane layer 906 in which a first contact 908 is formed. The backplane substrate 902 also includes an electrically-insulating passivation layer 912. In the embodiment shown, the high-pixel-density structure 900 may be part of a vertical LED structure in which a portion of the control circuitry for the structure is formed in the backplane substrate 902, and another portion of the control circuitry (not shown) is positioned on a side of the LED structures that is opposite the backplane substrate 902. The LED substrate 904 may include a stack of LED material layers formed on substrate layer 916. The LED material layers may include a gallium-and-nitrogen-containing layer 914, a transparent conductive layer 918, a mirror layer 920, and a bonding layer 922. The LED substrate 904 may also include pixel isolation structures 924 formed in an orthogonal direction to other layers of the LED substrate 904. In embodiments, the pixel isolation structures 924 may be made of reflective and conductive materials (e.g., a metal) and may be surrounded by electrically-insulating pixel isolation passivation layers 926 to prevent the pixel isolation structures for shorting the LED structures formed in the gallium-and-nitrogen-containing layer 914. In the embodiment shown in FIG. 9A, the LED structures and pixel isolation structures are already formed in the LED material layers before the backplane substrate 902 and LED substrate 904 are bonded together.

Figure 10A:
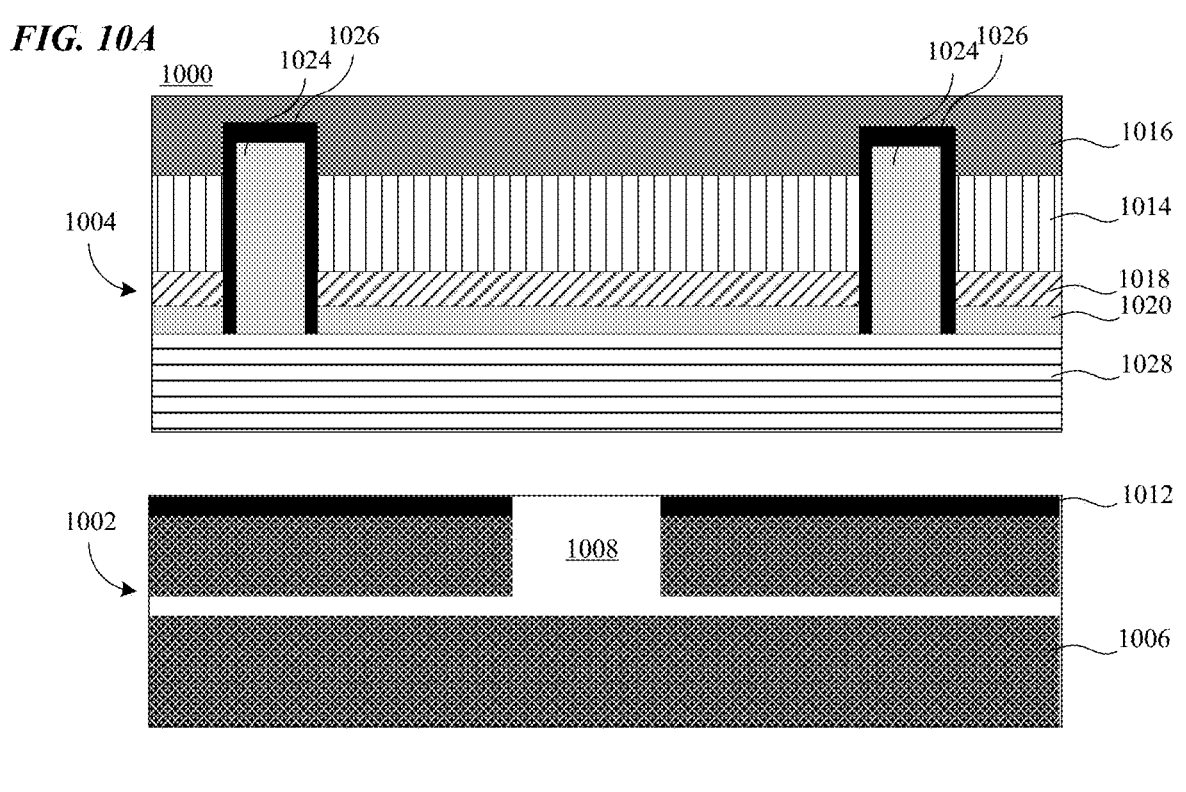
FIG. 10A and FIG. 10B show cross-sectional views of a still further semiconductor structure being processed according to embodiments of the present technology.

FIG. 10A shows yet another embodiment of a portion of a high-pixel-density structure 1000 having a separate backplane substrate 1002 and LED substrate 1004. The backplane substrate 1002 includes a backplane layer 1006 in which a first contact 1008 is formed. The backplane substrate 1002 also includes an electrically-insulating passivation layer 1012. In the embodiment shown, the high-pixel-density structure 1000 may be part of a vertical LED structure in which a portion of the control circuitry for the structure is formed in the backplane substrate 1002, and another portion of the control circuitry (not shown) is positioned on a side of the LED structures that is opposite the backplane substrate 1002. The LED substrate 1004 may include a stack of LED material layers formed on substrate layer 1016. The LED material layers may include a gallium-and-nitrogen-containing layer 1014, a transparent conductive layer 1018, a mirror layer 1020, and a bonding layer 1022. The LED substrate 1004 may also include pixel isolation structures 1024 formed in an orthogonal direction to other layers of the LED substrate 1004. In embodiments, the pixel isolation structures 1024 may be made of reflective and conductive materials (e.g., a metal) and may be surrounded by electrically-insulating pixel isolation passivation layers 1026 to prevent the pixel isolation structures for shorting the LED structures formed in the gallium-and-nitrogen-containing layer 1014. In additional embodiments, the LED substrate 1004 may include a dielectric layer 1028 in contact with the mirror layer 1020 and pixel isolation structures 1024. In the embodiment shown in FIG. 10A, the LED structures and pixel isolation structures are already formed in the LED material layers before the backplane substrate 1002 and LED substrate 1004 are bonded together.

In embodiments of the present technology, method 500 may further include operations to pattern the LED structures at operation 515, isolate the subpixels at operation 520, and bond together the backplane substrate and the LED substrate at operation 525. In embodiments, operations 515, 520, and 525, may be performed in a different order. In some embodiments, the LED structures may be patterned on an LED substrate at operation 515 before the backplane substrate and the LED substrate are bonded together at operation 525. In additional embodiments, the backplane substrate and the LED substrate are bonded together at operation 525 before the LED structures may be patterned on the LED substrate (or LED layer materials) at operation 515. In still further embodiments, the subpixels may be isolated from each other at operation 520 before or after the LED structures are formed in the LED substrate at operation 515, and before or after the backplane substrate and the LED substrate are bonded together at operation 525.

Figure 6D:
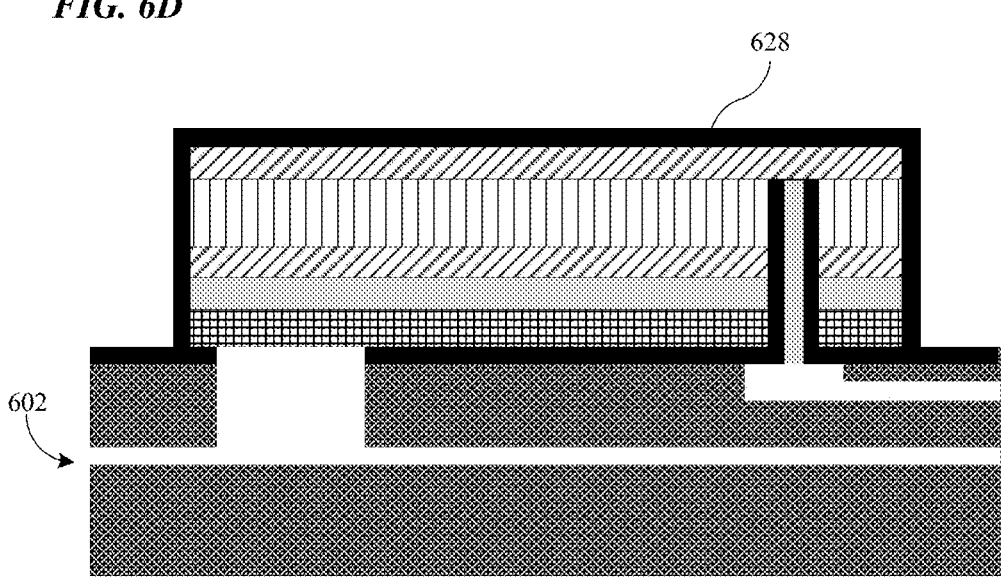

FIG. 6B shows an embodiment where the backplane substrate 602 and LED substrate 604 are bonded together before the LED structures are patterned into the LED substrate or the pixel isolation structures are formed. In the embodiment shown, first contact 608 is formed through the passivation layer 612 to form an electrically conductive interface between the first contact and the bonding layer 622 when the backplane substrate 602 and LED substrate 604 are bonded together. After the substrates 602 and 604 are bonded together, the LED structures are patterned into the combined substrates, as shown in FIG. 6C and FIG. 6D. FIG. 6C shows an electrically conductive via 624 formed between the second contact 610 and a surface of the gallium-and-nitrogen-containing layer 614 that is opposite the surface in electrical contact with the first contact 608. In additional embodiments, the first contact 608 may be in electrical contact with a P-pad contact (not shown) of the gallium-and-nitrogen-containing layer 614 while the second contact 610 may be in electrical contact with an N-pad contact (not shown) of the layer 614. In further embodiments, an electrically-insulating passivation layer 626 may be in contact with the via 624 to prevent an electrical short circuit between the p-doped and n-doped regions of the gallium-and-nitrogen-containing layer 614. FIG. 6D shows the LED structure after it is patterned on the backplane substrate 602. In the embodiment shown, another electrically-insulating passivation layer 628 is formed around the LED structure to prepare for the formation of the pixel isolation operation.

Figure 6E:
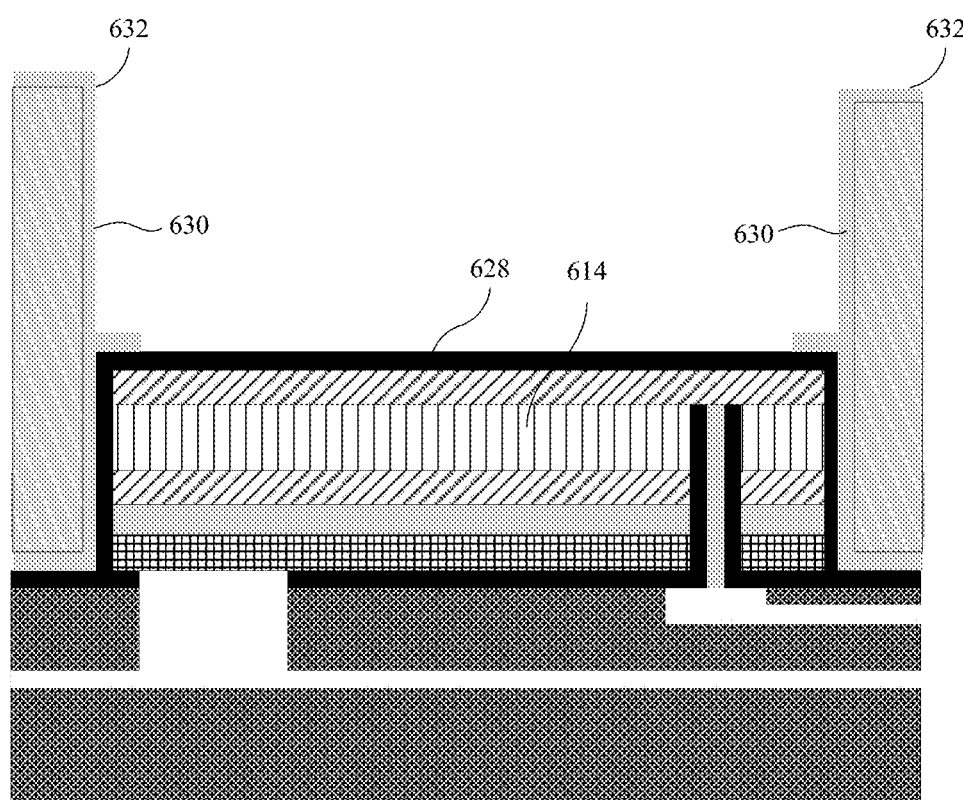

FIG. 6E shows a pixel isolation structure formed around the previously-formed LED structure. In the embodiment shown, the pixel isolation structure includes mirror layer 630 and pixel isolation columns 632. The mirror layer 630 may be operable to reflect light emitted from the gallium-and-nitrogen-containing layer 614 towards a quantum-dot-layer (not shown) that will be subsequently formed above the LED structure and between the pixel mirror layer and pixel isolation columns 632. In still further embodiments, a portion of the mirror layer 630 formed over the LED passivation layer 628 may be removed so that light emitted by the gallium-and-nitrogen-containing layer 614 can pass into the space holding the quantum-dot-layer. The LED passivation layer 628 is made to have high transmittance of the emitted light.

Figure 7B:
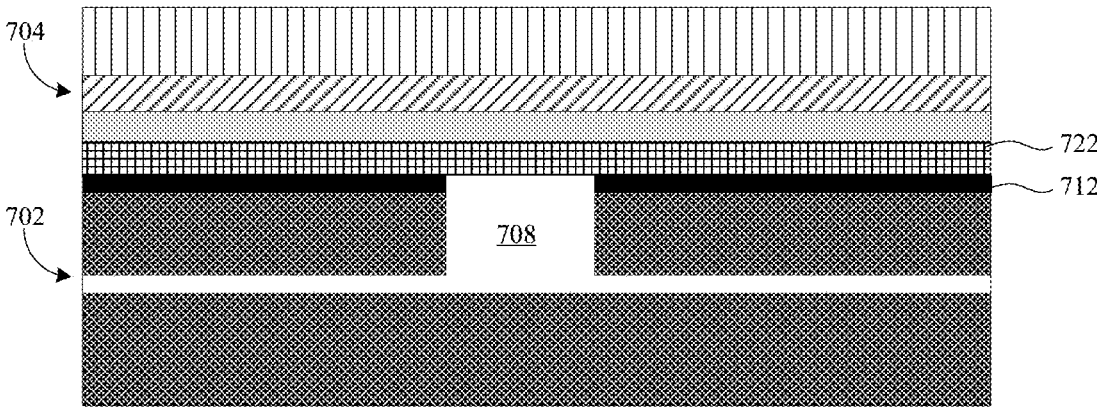
Figure 7C:
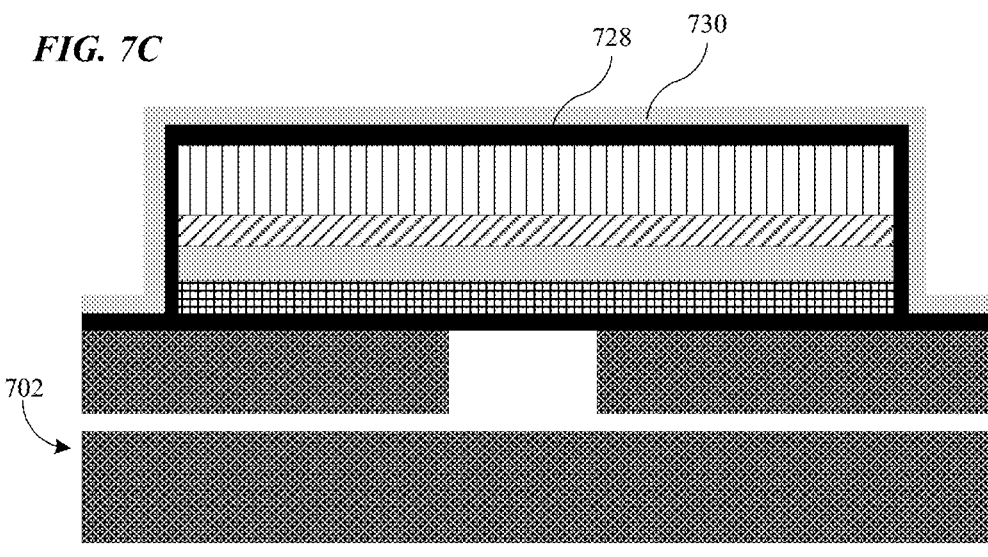

FIG. 7B also shows the backplane substrate 702 and LED substrate 704 bonded together before the LED structures are patterned into the LED substrate or when the pixel isolation structures are formed. First contact 708 is formed through the passivation layer 712 to form an electrically conductive interface between the contact and the bonding layer 722 when the backplane substrate 702 and LED substrate 704 are bonded together. After the substrates 702 and 704 are bonded together, the LED structures are patterned into the combined substrates, as shown in FIG. 7C. In the embodiment shown, the LED structure is patterned on the backplane substrate 702, and another electrically-insulating passivation layer 728 and mirror layer 730 are formed around the LED structure before a pixel isolation structure is formed.

Figure 7D:
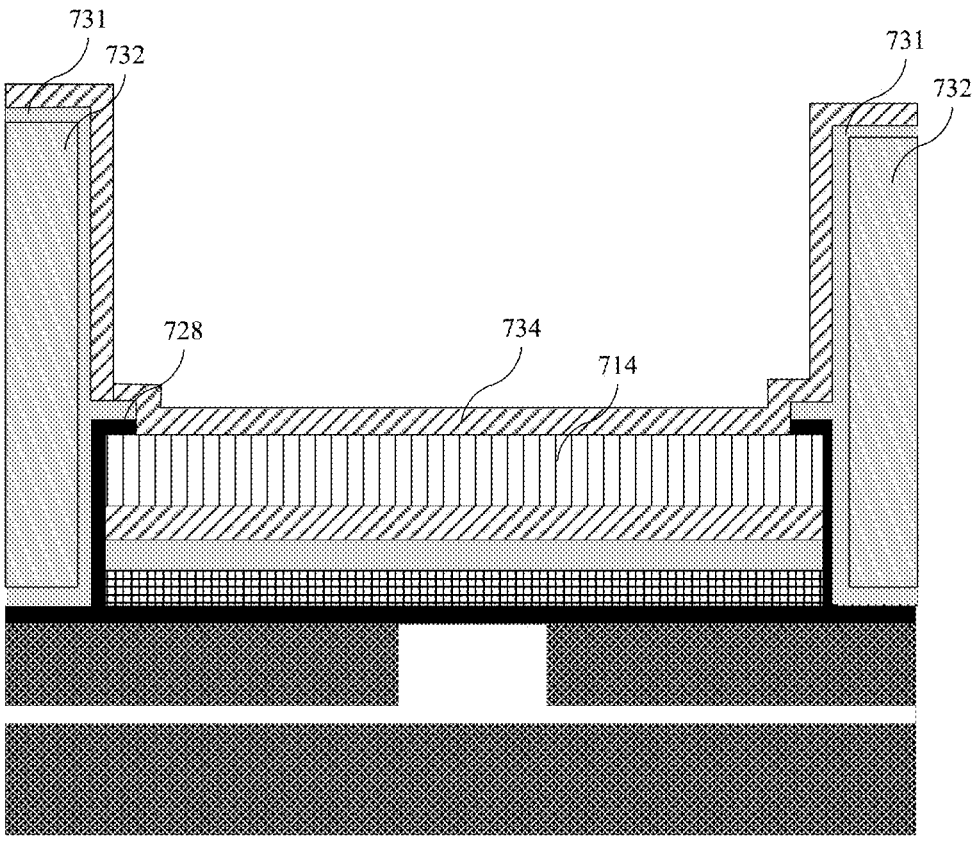

FIG. 7D shows a pixel isolation structure formed around the previously-formed LED structure. In the embodiment shown, the pixel isolation structure includes an additional portion of mirror layer 731 and pixel isolation columns 732. The pixel isolation structure further includes an additional transparent conductive layer 734 formed on the sidewalls of the pixel isolation structures and a surface of the gallium-and-nitrogen-containing layer 714. The mirror layer 731 may be operable to reflect light emitted from the galliumand-nitrogen-containing layer 714 towards a quantum-dot-layer (not shown) that will be subsequently formed above the LED structure and between the pixel mirror layer and pixel isolation columns 732. In still further embodiments, a portion of the mirror layer 730 and LED passivation layer 728 may be removed and replaced by the additional transparent conductive layer 734. Light emitted from the gallium-and-nitrogen-containing layer 714 can pass through the additional transparent conductive layer 734 into the space holding the quantum-dot-layer.

Figures 7E, 7F:
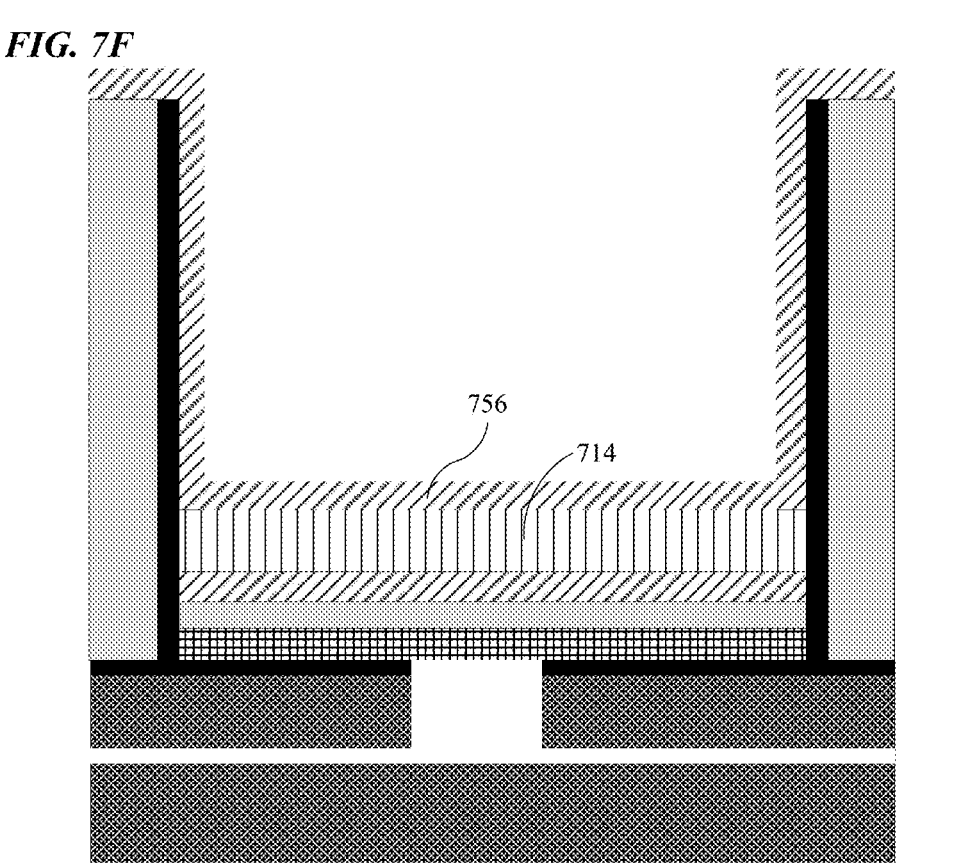

FIGS. 7E and 7F show another embodiment for patterning the LED structures and isolating the subpixels according to embodiments of the present technology. FIG. 7E shows a dielectric material 750 being deposited and patterned on the LED substrate layers with the LED structure. The patterned dielectric material 750 may create a sacrificial column upon which the pixel isolation structures may be formed. In the embodiment shown, a passivation layer 752 and pixel isolation columns 754 are deposited and patterned over patterned dielectric material 750. FIG. 7F shows the patterned dielectric material has been removed to create an opening that includes the gallium-and-nitrogen-containing layer 714 at the bottom and the pixel isolation structure at the sidewalls (including the passivation layer and the pixel isolation columns). In additional embodiments, another transparent conductive layer 756 may be formed on the gallium-and-nitrogen-containing layer 714 and the pixel isolation structures.

Figure 8B:
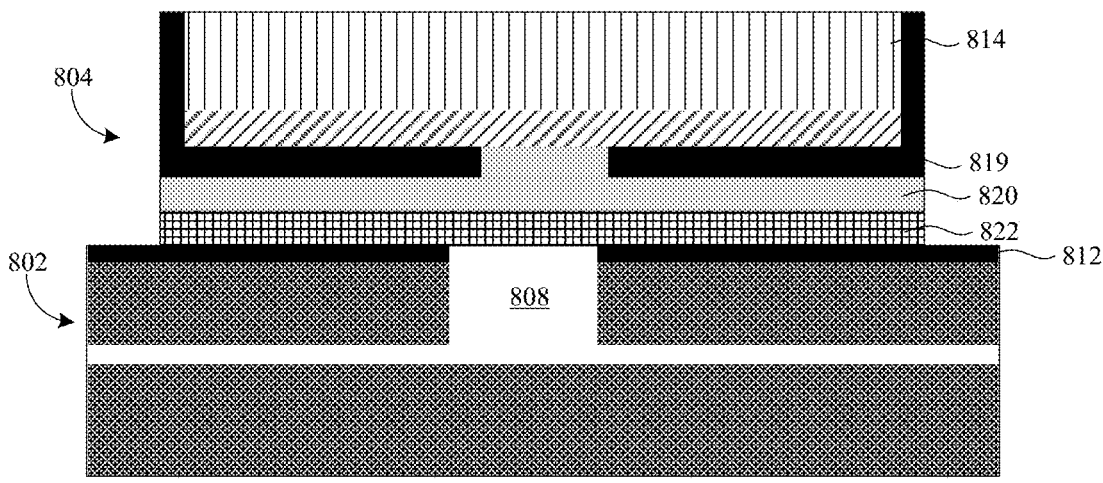

FIG. 8B shows an embodiment where the backplane substrate 802 and LED substrate 804 are bonded together after the LED structures are patterned into the LED substrate. In the embodiment shown, contact 808 is formed through the passivation layer 812 to form an electrically conductive interface between the contact and the bonding layer 822 when the backplane substrate 802 and LED substrate 804 are bonded together. Also in the embodiment, the substrate layer is removed to expose the gallium-and-nitrogen-containing layer 814. In additional embodiments, pixel isolation structures (not shown) may be formed along the sidewalls of the LED structure, including the sidewalls of the bonding layer 822, the mirror layer 820, and the passivation layer 819. In further embodiments, the pixel isolation structures may include electrically insulating passivation layers and columns of pixel isolation material such as metal or dielectric material. In still further embodiments, the pixel isolation structures may include an additional mirror layer formed on the interior sidewalls of the structures to reflect light towards a quantum dot layer (not shown) positioned in the opening formed by the pixel isolation structures and the LED structure.

Figure 9B:
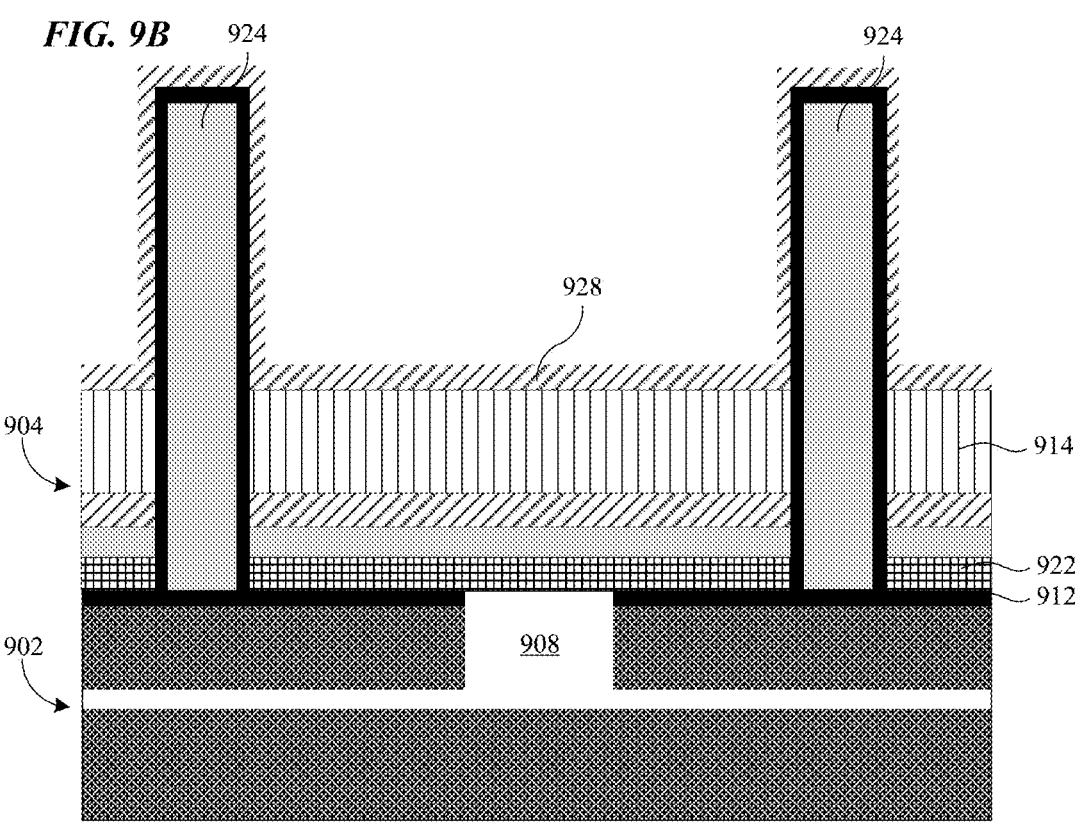

FIG. 9B shows an embodiment where the backplane substrate 902 and LED substrate 904 are bonded together after the LED structures and at least a portion of the pixel isolation structures are patterned into the LED substrate. In the embodiment shown, contact 908 is formed through the passivation layer 912 to form an electrically-conductive interface between the contact and the bonding layer 922 when the backplane substrate 902 and LED substrate 904 are bonded together. Also in the embodiment, the substrate layer is removed to expose the gallium-and-nitrogen-containing layer 914 and the top portions of the pixel isolation structures 924. In embodiments, an additional transparent conductive layer 928 may be formed on the gallium-and-nitrogen-containing layer 914 and the pixel isolation structures 924.

Figure 10B:
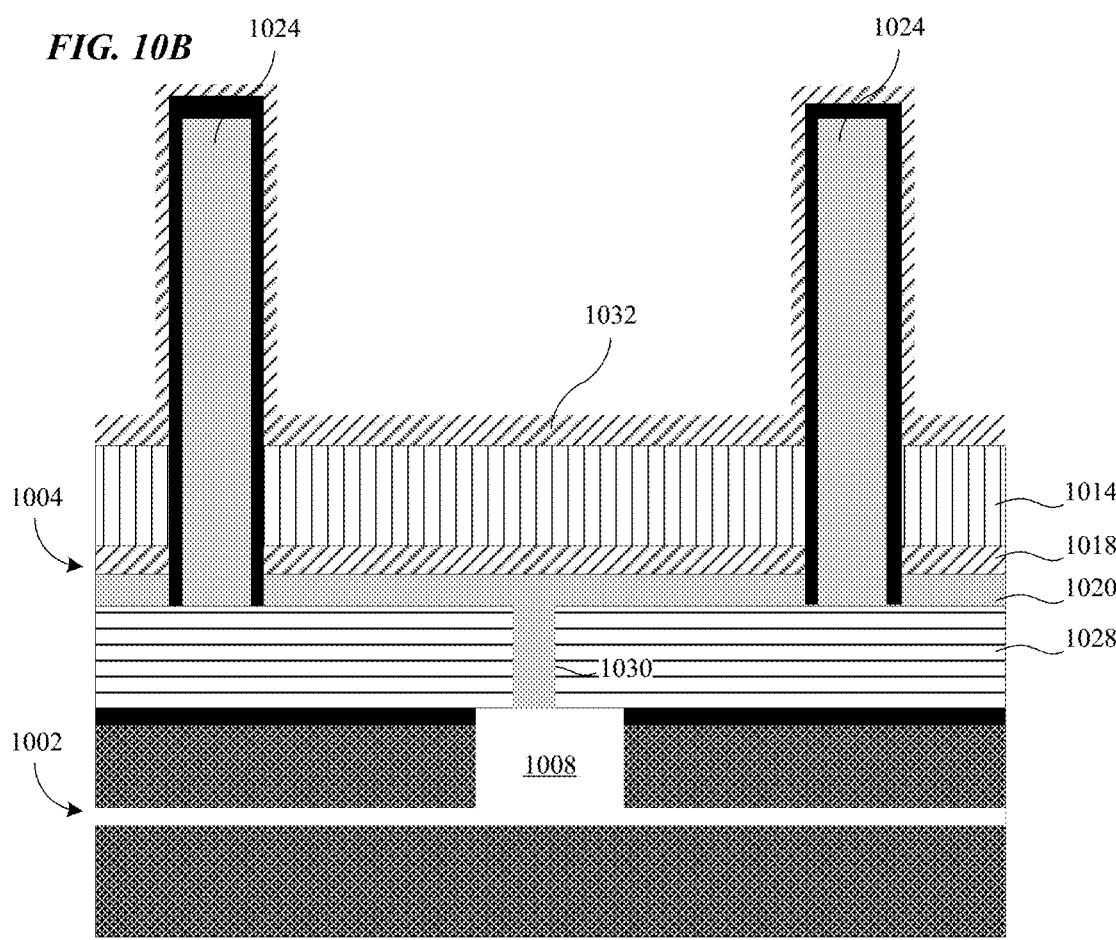

FIG. 10B shows another embodiment where the backplane substrate 1002 and LED substrate 1004 are bonded together after the LED structures and at least a portion of the pixel isolation structures is patterned into the LED substrate. In the embodiment shown, an electrically-conductive interconnect 1030 is formed in the dielectric layer 1028 to create an electrical conduction pathway between the contact 1008 in the backplane layer 1006 and the mirror layer 1020, transparent conductive layer 1018, and gallium-and-nitrogen-containing layer 1014 in the LED structure. Also in the embodiment, the substrate layer 1016 is removed to expose the gallium-and-nitrogen-containing layer 1014 and the top portions of the pixel isolation structures 1024. In embodiments, an additional transparent conductive layer 1032 may be formed on the gallium-and-nitrogen-containing layer 1014 and the pixel isolation structures 1024.

Referring back to FIG. 5, method 500 may still further include the formation of quantum dot layers in the isolated LED subpixel structures at operation 530. In embodiments, the formation of the quantum dot layers may include sequential operations to form a quantum dot layer operable to emit light characterized by a particular peak intensity wavelength in one of the subpixels of each LED pixel of the array of LED pixels. In further embodiments, the sequential operations may include forming a red quantum dot layer in one of the subpixels of each LED pixel, then forming a green quantum dot layer in another one of the subpixels, and then forming a blue quantum dot layer in still another one of the subpixels. Following the formation of the blue quantum dot, each LED pixel in the array of LED pixels includes red, green, and blue subpixels.

In additional embodiments, the formation of a quantum dot layer operable to emit a particular color of visible light (e.g., red, green, or blue light) in a LED subpixel may include dispensing a photo-curable fluid over the high-pixel-density LED structure, activating one of the subpixels in each LED pixel in the array of LED pixels to illuminate and cure the photo-curable fluid over that subpixel, and removing the uncured photo-curable fluid from the other subpixels that were not activated. These formation operations may be repeated for the subpixels emitting each color of light in the array of LED pixels. In embodiments, the formation operation self-aligns the quantum-dot layers with the activated subpixels of the LED pixels throughout the array of LED pixels. No precision alignment operations are required to form the quantum-dot layers in the proper group of subpixels. The self-alignment of the quantum-dot layers is increasingly beneficial as the size of the subpixels decreases and the pixel density increases.

In embodiments, the photo-curable fluid may include one or more cross-linkable compounds, a photo-initiator, and a color conversion agent. In additional embodiments, the cross-linkable compounds may include monomers that form a polymer when cured. In more embodiments, the monomers may include acrylate monomers, methacrylate monomers, and acrylamide monomers. In yet more embodiments, the cross-linkable compounds may include a negative photoresist material such as SU-8 photoresist. In further embodiments, the photo-initiator may include phosphine oxide compounds and keto compounds, among other kinds of photo-initiator compounds that generate radicals that initiate the curing of unsaturated compounds when excited by ultraviolet light. Commercially available photo-initiator compounds include Irgacure 184, Irgacure 819, Darocur 1173, Darocur 4265, Darocur TPO, Omnicat 250, and Omnicat 550, among other photo-initiators. In still further embodiments, the color conversion agent may include a quantum dot material that can absorb shorter wavelength (i.e., more energetic) light from the LED structure and emit longer wavelength light corresponding to the color of light emitted by the subpixel. In embodiments, these quantum-dot materials may include nanoparticles made of one or more kinds of inorganic semiconductor materials such as indium phosphide, zinc selenide, zinc sulfide, silicon, silicates, and graphene, and doped inorganic oxides, among other semiconductor materials.

Method 500 may also include testing the subpixels after the formation of the quantum dot layers in operation 535. In some embodiments, the subpixels may be tested after the formation of each color of the quantum-dot layers. In additional embodiments, the subpixels may be tested after all the quantum-dot layers have been formed. In still further embodiments, the testing operation may include activating all the subpixels and detecting which subpixels are defective. In embodiments, these defects may include subpixels that fail to generate any light, subpixels that fail to generate light at a constant intensity, and subpixels that fail to generate light at a target intensity (e.g., subpixels that are too dim or too bright), among other kinds of defects.

Method 500 may still further include substituting the defective subpixels in operation 540. In embodiments, the substitution may include forming a replacement quantum-dot layer in a quantum-dot-layer-free (blank) subpixel in the LED pixel. The replacement quantum-dot layer is operable to emit light at the same wavelength as the defective subpixel that will be deactivated. The substitution operation 540 may significantly reduce the number of faulty LED pixels in the high-pixel-density structure. In embodiments, the percentage of defective subpixels in the high-pixel-density structure may be reduced by greater than or about 75%, greater than or about 85%, greater than or about 95%, greater than or about 99%, or more. In additional embodiments, after substitution operation 540, the number of faulty LED pixels in the high-pixel-density structure may be less than or about 1 per 1000, less than or about 1 per 5000, less than or about 1 per 10,000, less than or about 1 per 25,000, less than or about 1 per 50,000, less than or about 1 per 75,000, less than or about 1 per 100,000, less than or about 1 per 250,000, less than or about 1 per 500,000, less than or about 1 per 750,000, less than or about 1 per 1,000,000, or less.

Method 500 may yet additionally include forming a UV barrier layer on the subpixels of the LED pixels at operation 545. In embodiments, the UV barrier layer may be formed over the quantum-dot-layers in the subpixels that include quantum-dot layers, and over the LED structure in the quantum-dot-layer-free subpixels. In further embodiments, the UV barrier layer may be a dielectric layer that absorbs UV light generated by the LED structure in the subpixel while transmitting the visible light emitted by the quantum-dot-layers. In embodiments, the dielectric layer may be a silicon oxide layer deposited by chemical vapor deposition or physical vapor deposition. In additional embodiments, the UV barrier layer may be made from organic polymers such as polyacrylates, polymethyl methacrylates, and copolymers of polyacrylates and polymethyl methacrylates. In yet further embodiments, the UV barrier layer may be made from commercially available materials such as Tinuvin Carbo-Protect from BASF, and the Eversorb series from Everlight. In embodiments, the UV barrier layer may reduce the percentage of UV light in the total light emitted from the high-pixel-density structure to less than or about 5%, less than or about 2.5%, less than or about 1%, less than or about 0.5%, less than or about 0.1%, less than or about 0.05%, less than or about 0.01%, or less. In additional embodiments, the UV barrier layer may transmit visible light from the quantum-dot layer at greater than or about 50%, greater than or about 75%, greater than or about 85%, greater than or about 90%, greater than or about 95%, greater than or about 99%, or more.

Method 500 may still additionally include forming a microlens on one or more of the subpixels in the LED pixels of the array of LED pixels at operation 550. In embodiments, microlenses may be formed on two or more of the subpixels, three or more of the subpixels, and all of the subpixels in each of the LED pixels. In additional embodiments, the microlenses may be convex-shaped lenses, concave-shaped lenses, Fresnel-shaped lenses, among other lens shapes. In further embodiments, the microlenses may be made of inorganic or organic materials that can transmit the visible light emitted from the subpixels. In additional embodiments, the microlenses may be made of polymers such as polydimethylsiloxanes, polyacrylates, polymethyl methacrylates, polybutyl methacrylates, polystyrenes, and poly(benzyl methacrylates), among other polymers. In more embodiments, the microlenses may be made of inorganic materials such as silica, zinc oxide, and aluminum oxide, among other inorganic materials. The microlenses bend and focus the light emitted by the high-pixel-density structure to increase image quality for specific applications such as VR headsets and AR glasses, among other applications.

Embodiments of the present methods, such as method 500, may be used to fabricate high-pixel-density structures with pixel densities greater than or about 1000 ppi, greater than or about 1250 ppi, greater than or about 1500 ppi, greater than or about 1750 ppi, greater than or about 2000 ppi, greater than or about 2500 ppi, greater than or about 2750 ppi, greater than or about 3000 ppi, or more. In embodiments, the present methods include forming and isolating subpixels so that they have reduced crosstalk with adjacent subpixels. In additional embodiments, the present methods permit the fabrication of high-pixel-density structures with fewer defective pixels due to the operations of testing the subpixels and substituting the defective subpixels by forming a replacement quantum-dot-layer in a previously quantum-dot-layer free blank subpixel. The present methods permit the fabrication of high-pixel-density structures that can be incorporated into display devices such as virtual reality headsets and augmented reality glasses that require both high pixel density, fast response times, and the ability to display high-quality images.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either of the limits, both of the limits, or neither of the limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a pixel" includes a plurality of such pixels, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A display, comprising:
a first pixel, the first pixel comprising a first set of four subpixels, each subpixel of the first set of four subpixels having a light-emitting diode (LED) between adjacent isolation structures, wherein the adjacent isolation structures define subpixel wells with each well including a respective LED, three of the subpixels of the first set of four subpixels include quantum dot materials that fill the respective subpixel wells and that are configured to emit different colors, and a fourth subpixel of the first set of four subpixels includes a quantum-dot-free matrix material filling the respective subpixel well; and
a second pixel, the second pixel comprising a second set of four subpixels, each subpixel of the second set of four subpixels having an LED between adjacent isolation structures, wherein the adjacent isolation structures define subpixel wells with each well including a respective LED, three of the subpixels of the second set of four subpixels include quantum dot materials that fill the respective subpixel wells and that are configured to emit different colors, and a fourth subpixel of the second set of four subpixels includes a quantum dot material that fills the respective subpixel well and that is configured to emit a same green or red color as the quantum dot material of one of the three subpixels of the second set of four subpixels.

2. The display of claim 1, wherein each LED comprises a gallium-and-nitrogen-containing light-emitting-diode structure operable to emit a first-wavelength light characterized by a wavelength less than or about 400 nm.

3. The display of claim 2, wherein the quantum dot material is operable to absorb a first-wavelength light emitted from the LEDs and emit a second-wavelength light characterized by a longer wavelength than the first-wavelength light.

4. The display of claim 1, wherein the fourth subpixel of the first set of four subpixels comprises a UV barrier layer over the quantum-dot-free matrix material.

5. The display of claim 1, wherein the display comprises an array of pixels comprising the first pixel, the second pixel, and a plurality of additional pixels.

6. The display of claim 5, wherein the array of pixels has a pixel density of greater than or about 1000 pixels per inch.

7. The display of claim 1, further comprising a microlens on at least one of the subpixels in each of the first pixel and the second pixel.

8. The display of claim 1, further comprising:

a backplane layer;

an array of pixels in contact with the backplane layer, wherein the array of pixels comprises the first pixel and the second pixel; and a UV barrier layer on the array of pixels, wherein the UV barrier layer covers the quantum dot materials and the quantum-dot-free matrix material.

9. The display of claim 8, wherein at least one of the subpixels further comprises a microlens in contact with the UV barrier layer.

10. The display of claim 8, wherein the backplane layer comprises a silicon-containing layer with CMOS devices in electrical contact with each of the subpixels in each of the LED pixels.

11. The display of claim 1, wherein the display is incorporated into a LED display for a virtual reality headset or augmented reality glasses.

12. The display of claim 1, wherein each subpixel has a respective microlens disposed thereover.

13. The display of claim 1, wherein a longest dimension of each of the subpixels is less than or about 10 μm.

14. The display of claim 1, wherein the isolation structures prevent light emitted from one of the subpixels from being absorbed by an adjacent subpixel.

15. The display of claim 1, wherein each subpixel comprises a gallium-and-nitrogen-containing light-emitting diode structure.

\* \* \* \* \*